(12) United States Patent
Hsu et al.

(10) Patent No.: US 8,324,102 B2
(45) Date of Patent: Dec. 4, 2012

(54) TECHNIQUES FOR IMPEDING REVERSE ENGINEERING

(75) Inventors: Louis L. Hsu, Fishkill, NY (US); Rajiv V. Joshi, Yorktown Heights, NY (US); David W. Kruger, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/169,248

(22) Filed: Jun. 27, 2011

(65) Prior Publication Data

US 2011/0256720 A1  Oct. 20, 2011

Related U.S. Application Data

(62) Division of application No. 11/924,735, filed on Oct. 26, 2007, now Pat. No. 7,994,042.

(51) Int. Cl.
*H01L 21/00* (2006.01)

(52) U.S. Cl. ............... 438/675; 438/599; 438/637

(58) Field of Classification Search ................ 438/599, 438/675, 637
See application file for complete search history.

(56) References Cited

U.S. PATENT DOCUMENTS

| 4,766,516 | A |   | 8/1988  | Ozdemir et al. |          |
|-----------|---|---|---------|----------------|----------|
| 5,202,591 | A | * | 4/1993  | Walden         | 326/8    |
| 5,336,624 | A | * | 8/1994  | Walden         | 438/200  |
| 5,475,251 | A | * | 12/1995 | Kuo et al.     | 257/316  |
| 5,783,846 | A | * | 7/1998  | Baukus et al.  | 257/204  |
| 5,930,663 | A | * | 7/1999  | Baukus et al.  | 438/598  |
| 6,284,627 | B1 |  | 9/2001  | Ramm et al.    |          |
| 6,528,885 | B2 | * | 3/2003 | Vajana et al.  | 257/758  |
| 6,614,080 | B2 | * | 9/2003 | Vajana et al.  | 257/390  |
| 6,737,345 | B1 | * | 5/2004 | Lin et al.     | 438/601  |
| 6,791,191 | B2 | * | 9/2004 | Chow et al.    | 257/775  |
| 6,924,552 | B2 |  | 8/2005  | Baukus et al.  |          |
| 7,128,271 | B2 |  | 10/2006 | Kim           |          |
| 7,224,014 | B2 | * | 5/2007 | Ichimura      | 257/301  |
| 7,361,611 | B2 | * | 4/2008 | Chakravarti et al. | 438/778 |
| 7,723,202 | B2 | * | 5/2010 | Eto           | 438/396  |
| 7,994,042 | B2 | * | 8/2011 | Hsu et al.    | 438/599  |
| 8,168,487 | B2 | * | 5/2012 | Clark et al.  | 438/183  |
| 2004/0222014 | A1 | * | 11/2004 | Heffner     | 174/250  |
| 2008/0079082 | A1 | * | 4/2008  | Clark et al. | 257/368 |
| 2009/0111257 | A1 | * | 4/2009  | Hsu et al.   | 438/599 |
| 2011/0256720 | A1 | * | 10/2011 | Hsu et al.   | 438/675 |

FOREIGN PATENT DOCUMENTS

| WO | WO/02/059964 A2 | 8/2002 |
|----|-----------------|--------|
| WO | WO/2004/030097 A1 | 4/2011 |

* cited by examiner

*Primary Examiner* — Laura Menz
(74) *Attorney, Agent, or Firm* — Preston Young; Michael J. Chang, LLC

(57) ABSTRACT

Anti-reverse engineering techniques are provided. In one aspect, a method for forming at least one feature in an insulating layer is provided. The method comprises the following steps. Ions are selectively implanted in the insulating layer so as to form at least one implant region within the insulating layer, the implanted ions being configured to alter an etch rate through the insulating layer within the implant region. The insulating layer is etched to, at the same time, form at least one void both within the implant region and outside of the implant region, wherein the etch rate through the insulating layer within the implant region is different from an etch rate through the insulating layer outside of the implant region. The void is filled with at least one conductor material to form the feature in the insulating layer.

6 Claims, 11 Drawing Sheets

NOR-GATE

FIG. 6G

NOR-GATE

FIG. 6H

NAND-GATE

FIG. 6I

NAND-GATE

TECHNIQUES FOR IMPEDING REVERSE ENGINEERING

CROSS-REFERENCE TO RELATED APPLICATIONS

This application is a divisional of U.S. application Ser. No. 11/924,735 filed on Oct. 26, 2007, the contents of which are incorporated by reference herein.

FIELD OF THE INVENTION

The present invention relates to anti-reverse engineering techniques, and more particularly, to measures taken in integrated circuit design to impede reverse engineering efforts.

BACKGROUND OF THE INVENTION

The practice of reverse engineering is present throughout many different industries. In general, reverse engineering involves taking an object apart in order to copy and/or improve the object. Reverse engineering has gained widespread use in the computer industry, for both hardware and software applications.

The problem with reverse engineering practices is that companies invest a large amount of resources into research and development efforts to come up with new products, only to have a competitor prey on those efforts by copying the products using reverse engineering. Thus, reverse engineering practices put innovative companies at a competitive disadvantage.

To impede reverse engineering efforts, companies look to employ product designs that cannot be easily copied by others. This tactic is referred to as "anti-reverse engineering." Anti-reverse engineering practices are described, for example, in U.S. Pat. No. 6,614,080 issued to Vajana et al., entitled "Mask Programmed ROM Inviolable By Reverse Engineering Inspections and Method of Fabrication" (hereinafter "Vajana '080"). Vajana '080 describes a method to provide false interconnection contacts in a read only memory (ROM) device to make reverse engineering more difficult. See also, U.S. Pat. No. 6,528,885 issued to Vajana et al., entitled "Anti-Deciphering Contacts" (hereinafter "Vajana '885") wherein a plurality of false contacts and/or false interconnections are provided, i.e., in a flash memory cell, to mislead people trying to copy the design.

There are notable limitations/drawbacks associated with the anti-reverse engineering approaches described in Vajana '080 and Vajana '885. For example, the techniques described therein are not generally applicable to non-memory or random logic circuits. Further, these techniques involve true interconnection contacts in the device by a two step process. For example, in Vajana '080, a "lower part" of a contact in an active area is first formed, followed by a later formation of an "upper part" of the contact in the same active area. Creating contacts in this manner requires that the "lower" and "upper" parts of the contact are perfectly aligned with one another, otherwise the contact resistance can be unacceptably high. Further, these techniques involve multiple steps to form true interconnection contacts and false interconnection contacts on the same device. See, for example, in Vajana '885, wherein false contacts are first masked, etched and the etch removed before a similar masking and etching procedure is carried out to form true contacts. This is a time intensive process, which can increase production times and decrease output, and further requires precise alignment through various different masking and etching steps.

U.S. Pat. No. 6,284,627 issued to Ramm et al., entitled "Method for Wiring Semi-conductor Components in Order to Prevent Product Piracy and Manipulation, Semi-conductors Component Made According to This Method and Use of Said Semi-conductor Component in a Chip Card," describes a method of fabricating a metallized circuit structure for preventing product piracy and product manipulation. For example, in a number of steps, a semiconductor component is formed within a substrate. The component substrate can then be joined by its front surface to a handling substrate. Electrical contacts are formed to the semiconductor component through the component substrate. Namely, the metallizations are built on the backside of the component substrate in order to avoid front side reverse engineering. The disadvantage of this method is that the process to fabricate the component substrate metallization is not a conventional process (i.e., it only applies to a silicon-on-insulator (SOI) substrate). Further, a more serious problem is that reverse engineering can still be performed on the backside of the chip.

Therefore, while teachings do exist for making integrated circuits that are resistant to unauthorized duplication through reverse engineering, they are limited in application and are complex and difficult to implement. As such, improved anti-reverse engineering techniques would be desirable.

SUMMARY OF THE INVENTION

The present invention provides anti-reverse engineering techniques. In one aspect of the invention, a method for forming at least one feature in an insulating layer is provided. The method comprises the following steps. Ions are selectively implanted in the insulating layer so as to form at least one implant region within the insulating layer, the implanted ions being configured to alter an etch rate through the insulating layer within the implant region. The insulating layer is etched to, at the same time, form at least one void both within the implant region and outside of the implant region, wherein the etch rate through the insulating layer within the implant region is different from an etch rate through the insulating layer outside of the implant region. The void is filled with at least one conductor material to form the feature in the insulating layer.

In another aspect of the invention, a method of forming a logic gate is provided. The method comprises the following steps. At least one metal oxide semiconductor device is fabricated on a substrate. At least one first insulating layer is deposited over the device. A first metal layer is formed over the first insulating layer, the first metal layer being interconnected with the device by way of one or more contacts present through the first insulating layer. At least one second insulating layer is deposited over the first metal layer. A plurality of vias are formed in the second insulating layer in contact with the first metal layer. At least one third insulating layer is deposited over the second insulating layer, so as to cover the vias. A second metal layer is formed in the third insulating layer.

The second metal layer is formed in the third insulating layer by the following steps. Ions are selectively implanted in the third insulating layer so as to form at least one implant region over one or more of the vias, the implanted ions being configured to alter an etch rate through the third insulating layer within the implant region. The third insulating layer is etched to, at the same time, form a pattern for the second metal layer both within the implant region and outside of the implant region, wherein the etch rate through the third insulating layer within the implant region is different from an etch rate through the third insulating layer outside of the implant region, and wherein the etch is performed for an amount of time needed to either etch completely through the third insulating layer within the implant region or etch completely through the third insulating layer outside of the implant region. The pattern is filled with a conductor material to form the second metal layer, wherein the second metal layer is in a non-contact position with one or more of the vias.

In yet another aspect of the invention, an anti-reverse engineering method for forming circuit blocks is provided. The method comprises the following steps. A plurality of circuit blocks are formed by the steps of forming at least one first metal layer; forming a plurality of vias in contact with the first metal layer; forming at least one second metal layer that is in a contact position with one or more of the vias and in a non-contact position with one or more of the other vias, wherein the vias that are in a contact position with the second metal layer are true vias and the vias that are in a non-contact position with the second metal layer are false vias. The first metal layer, the second metal layer and the vias are in a same location and a same position relative to one another in each of the circuit blocks. The vias which are in a contact position with the second metal layer and the vias which are in a non-contact position with the second metal layer are varied, from at least one of the circuit blocks to at least one other of the circuit blocks, so as to vary which of the vias are true vias and which of the vias are false vias.

A more complete understanding of the present invention, as well as further features and advantages of the present invention, will be obtained by reference to the following detailed description and drawings.

BRIEF DESCRIPTION OF THE DRAWINGS

FIGS. 6A-I are diagrams illustrating an exemplary anti-reverse engineering methodology for forming a logic gate device according to an embodiment of the present invention.

DETAILED DESCRIPTION OF PREFERRED EMBODIMENTS

In FIGS. 1A-D, FIGS. 2A-D, FIGS. 3A-E and FIGS. 4A-D, anti-reverse engineering techniques are provided for forming false features isolated by optically transparent etch stop films. One goal of the present teachings is to increase the time and effort one would need to expend to reverse engineer a device. False features, such as a false contact or via, impede reverse engineering efforts by making it difficult to determine which features are functional components of the device, i.e., true features, and which are not, i.e., the false features.

The use of a false feature provides a limited benefit, however, if the false feature is easily identifiable when the device is disassembled. According to the present teachings, optically transparent etch stop films are used to isolate false features, such as false vias, from the functional components, i.e., true features, of the device. Advantageously, if the device is disassembled, e.g., in a reverse engineering attempt, the optically transparent etch stop films will not be detectable by visible inspection. Therefore, it will not be apparent that some of the features are in fact false features.

In FIGS. 1A-D and FIGS. 2A-D, described below, optically transparent etch stop films are placed before a false feature is formed. In FIGS. 3A-E and FIGS. 4A-D, described below, false features are formed before the optically transparent etch stop films are placed.

Figure 1A:
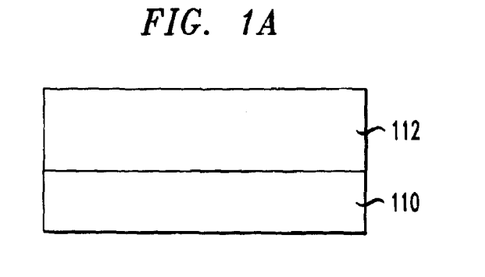
FIGS. 1A-D are diagrams illustrating an exemplary methodology for forming false features having an optically transparent etch stop film associated therewith according to an embodiment of the present invention.

Specifically, FIGS. 1A-D are diagrams illustrating an exemplary methodology for forming a false feature, i.e., false feature 118, having an optically transparent etch stop film, i.e., optically transparent etch stop film 116, associated therewith. Namely, as shown in FIG. 1A, substrate 110 is provided having insulating layer 112 thereon. The substrates and insulating layers depicted in FIGS. 1A-D, FIGS. 2A-D, FIGS. 3A-E and FIGS. 4A-D are meant to be representative of one or more of the layers that may be present in a device, such as a logic gate device (see below), into which false features can be formed.

Figure 1B:
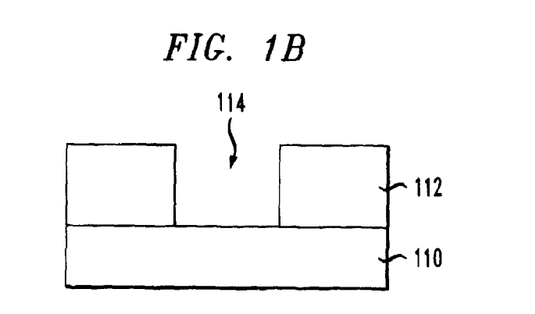

As shown in FIG. 1B, a void 114 is etched into insulating layer 112. Since void 114 will define the false feature, void 114 can be configured, e.g., as a hole or a trench, depending on whether the false feature to be formed is, e.g., a false via or a false metal line, respectively.

Figure 1C:
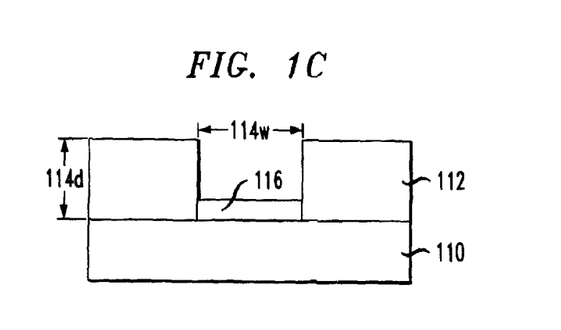

As shown in FIG. 1C, optically transparent etch stop film 116 is placed within void 114. Optically transparent etch stop film 116 can comprise any suitable etch stop material which cannot be detected by visual inspection. Suitable optically transparent etch stop materials include, but are not limited to, aluminum oxide. Optically transparent etch stop film 116 can be placed within void 114 in a number of different ways. According to one exemplary embodiment, optically transparent etch stop film 116 is placed within void 114 using a lift-off mask procedure. Alternatively, depending on a shape/size of the false feature, optically transparent etch stop film 116 can be formed within void 114 using a conformal deposition process, such as a conformal chemical vapor deposition (CVD) process. By way of example only, if void 114 has a width 114$w$ that is at least about two times greater than a depth 114$d$, then conformal deposition can be used.

Figure 1D:
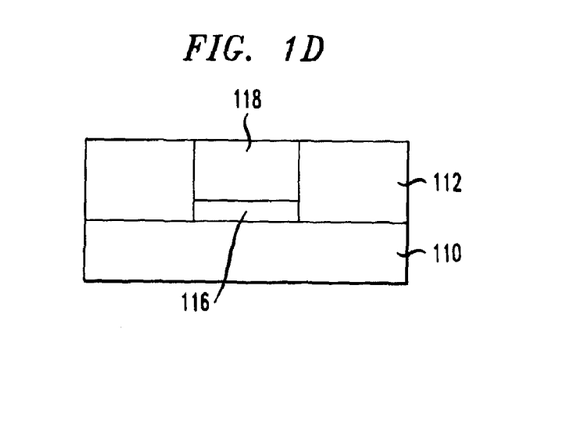

As shown in FIG. 1D, void 114 is filled with a conductor material, for example, using a damascene process, to form false feature 118. As such, optically transparent etch stop film 116 will be present beneath false feature 118, i.e., at a bottom of false feature 118. Therefore, optically transparent etch stop film 116 will have a same lateral dimension as false feature 118, and as such will not interfere with other components of the device, e.g., vias and/or metal lines adjacent to false feature 118 (which is especially beneficial in the case of scaled technology wherein tight dimensional tolerances are present).

Figure 2A:
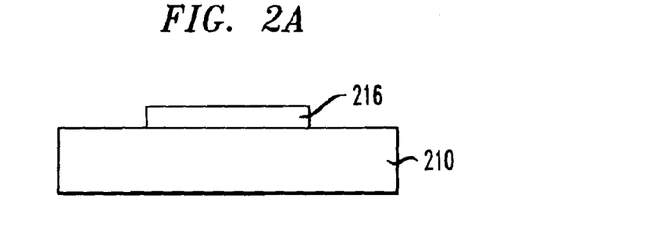
FIGS. 2A-D are diagrams illustrating another exemplary methodology for forming false features having an optically transparent etch stop film associated therewith according to an embodiment of the present invention.

FIGS. 2A-D are diagrams illustrating an exemplary methodology for forming a false feature, i.e., false feature 218, having an optically transparent etch stop film, i.e., optically transparent etch stop film 216, associated therewith. Namely, as shown in FIG. 2A, substrate 210 is provided. Optically transparent etch stop film 216 (e.g., aluminum oxide) is formed on substrate 210, e.g., using a lift-off process.

Figure 2B:
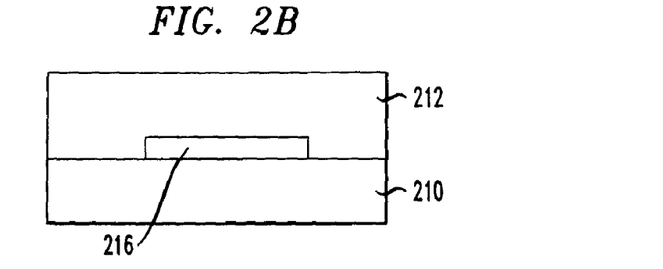
Figure 2C:
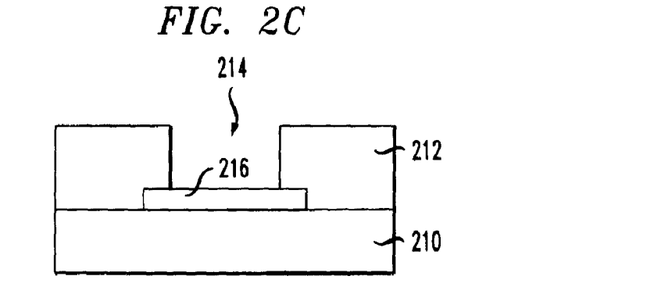

As shown in FIG. 2B, insulating layer 212 is deposited over substrate 210/optically transparent etch stop film 216. As shown in FIG. 2C, a void 214 is etched into insulating layer 212. Since void 214 will define the false feature, void 214 can be configured, e.g., as a hole or a trench, depending on whether the false feature to be formed is, e.g., a false via or a false metal line, respectively.

Figure 2D:
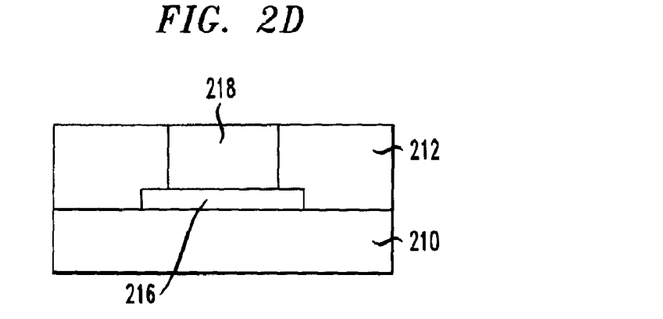

As shown in FIG. 2D, void 214 is filled with a conductor material, for example, using a damascene process, to form false feature 218. As such, optically transparent etch stop film 216 will be present beneath false feature 218.

Figure 3A:
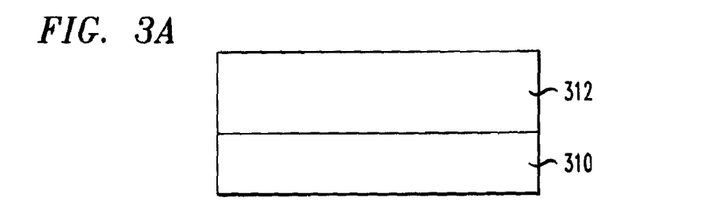
FIGS. 3A-E are diagrams illustrating yet another exemplary methodology for forming false features having an optically transparent etch stop film associated therewith according to an embodiment of the present invention.

FIGS. 3A-E are diagrams illustrating an exemplary methodology for forming a false feature, i.e., false feature 318, having an optically transparent etch stop film, i.e., optically transparent etch stop film 316, associated therewith. Namely, as shown in FIG. 3A, substrate 310 is provided having insulating layer 312 thereon.

Figure 3B:
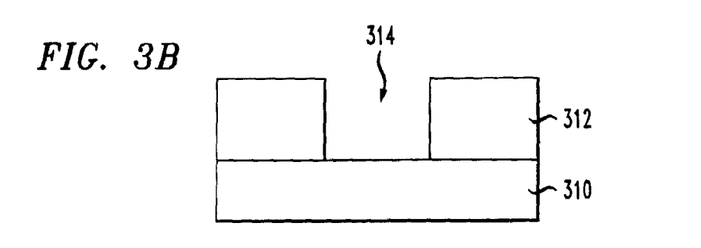

As shown in FIG. 3B, a void 314 is etched into insulating layer 312. Since void 314 will define the false feature, void 314 can be configured, e.g., as a hole or a trench, depending on whether the false feature to be formed is, e.g., a false via or a false metal line, respectively.

Figure 3C:
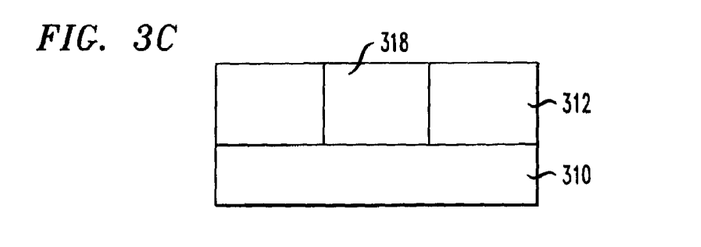
Figure 3D:
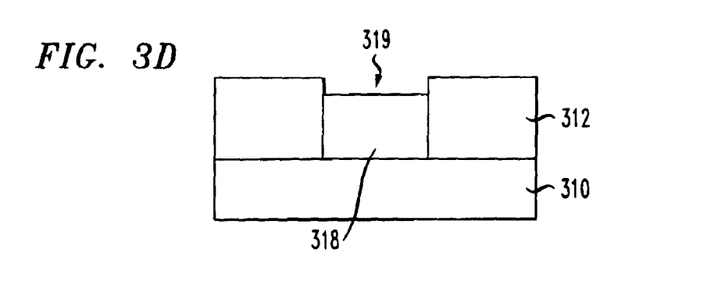

As shown in FIG. 3C, void 314 is filled with a conductor material, for example, using a damascene process, forming false feature 318. As shown in FIG. 3D, a recess 319 is formed in a top portion of false feature 318. According to an exemplary embodiment, recess 319 is formed using photolithography, wherein a photoresist is masked and patterned over false feature 318. Reactive ion etching (RIE) with a controlled etch rate is then used to etch recess 319 into the top portion of false feature 318.

Figure 3E:
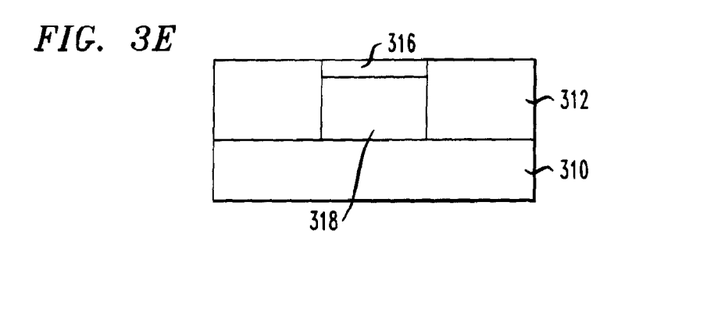

As shown in FIG. 3E, recess 319 is filled with an optically transparent etch stop material, such as aluminum oxide. The optically transparent etch stop material is then polished back to a surface of insulating layer 312, e.g., using chemical-mechanical polishing (CMP), to form optically transparent etch stop film 316. Recessing the optically transparent etch stop film advantageously provides a planar surface for subsequent layer formation on top of insulating layer 312. As such, a false feature 318 is formed with optically transparent etch stop film 316 present thereon and recessed into the top portion thereof.

Figure 4A:
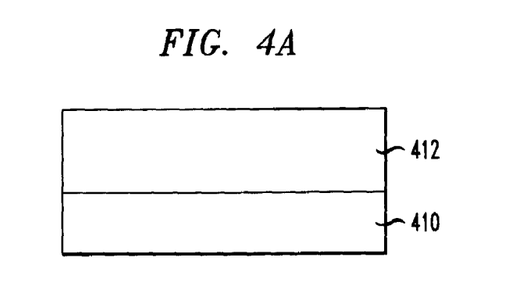
FIGS. 4A-D are diagrams illustrating still another exemplary methodology for forming false features having an optically transparent etch stop film associated therewith according to an embodiment of the present invention.

FIGS. 4A-D are diagrams illustrating an exemplary methodology for forming a false feature, i.e., false feature 418, having an optically transparent etch stop film, i.e., optically transparent etch stop film 416, associated therewith. Namely, as shown in FIG. 4A, substrate 410 is provided having insulating layer 412 thereon.

Figure 4B:
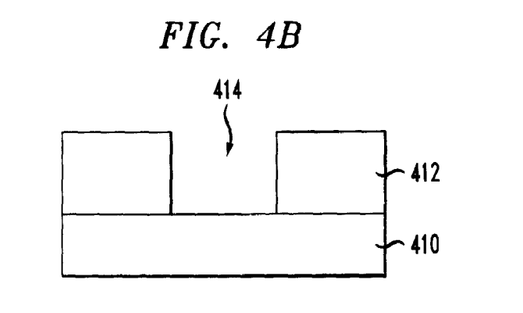

As shown in FIG. 4B, a void 414 is etched into insulating layer 412. Since void 414 will define the false feature, void 414 can be configured, e.g., as a hole or a trench, depending on whether the false feature to be formed is, e.g., a false via or a false metal line, respectively.

Figure 4C:
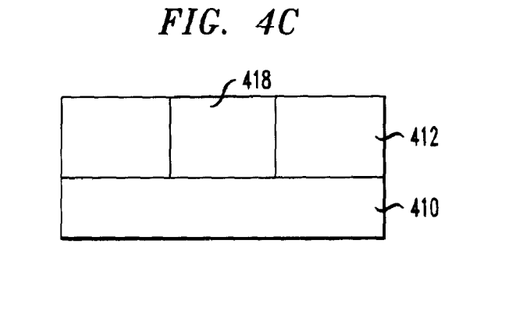
Figure 4D:
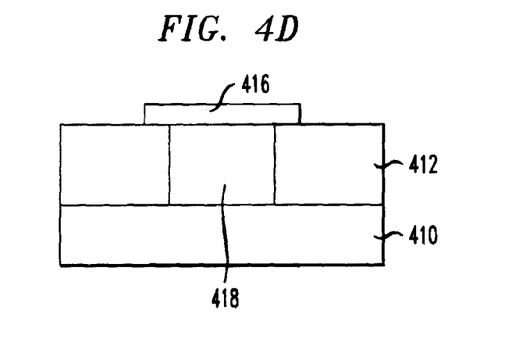

As shown in FIG. 4C, void 414 is filled with a conductor material, for example, using a damascene process, forming false feature 418. As shown in FIG. 4D, optically transparent etch stop film 416 (e.g., aluminum oxide) is placed over insulating layer 412/false feature 418, e.g., using a lift-off process. As such, a false feature 418 is formed with optically transparent etch stop film 416 present thereon.

FIGS. 5A-F are diagrams illustrating an exemplary methodology for forming false features in an insulating layer, i.e., insulating layer 512, by selectively altering etch rates therethrough. Namely, as will be described in detail below, select areas of the insulating layer can be modified by ion implantation to achieve a different etch rate, as compared to unmodified areas of the insulating layer. Advantageously, these differential etch rates through the insulating layer can be utilized to create different features, e.g., true features and false features, at the same time. As described above, false features impede reverse engineering efforts by making it difficult to determine which features are functionally necessary, i.e., the true features, and which are not, i.e., the false features.

Figure 5A:
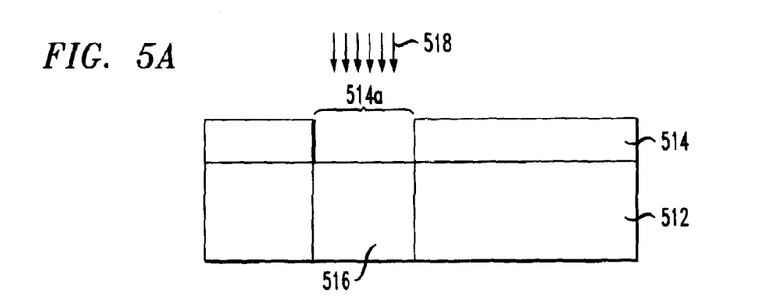
FIGS. 5A-F are diagrams illustrating an exemplary methodology for forming false features using modified etch rates according to an embodiment of the present invention.

Namely, as shown in FIG. 5A, a block out mask 514, e.g., photoresist, is deposited over insulating layer 512 and patterned to have an open area 514a therein. Ions are then implanted into insulating layer 512 though open area 514a (as indicated by arrows 518), to form implant region 516 in insulating layer 512. The particular ions implanted are chosen based on their ability to alter the etch rate through the implant region.

According to one exemplary embodiment, argon ions are implanted into insulating layer 512 to enhance the etch rate through implant region 516 when implant region 516 is etched by RIE. By way of example only, a RIE rate through implant region 516 having implanted argon ions can be between about 1.10 times and about 1.5 times faster than a RIE rate through an unmodified insulating layer 512.

According to another exemplary embodiment, nitrogen ions are implanted into insulating layer 512 to generate a nitride in implant region 516, and thereby reduce an etch rate through implant region 516 when implant region 516 is etched by RIE. By way of example only, a RIE rate through implant region 516 having implanted nitrogen ions can be between about 1.5 times and about three times slower than a RIE rate through an unmodified insulating layer 512. Once the ions have been implanted in insulating layer 512, the block out mask is preferably removed before etching.

Figure 5B:
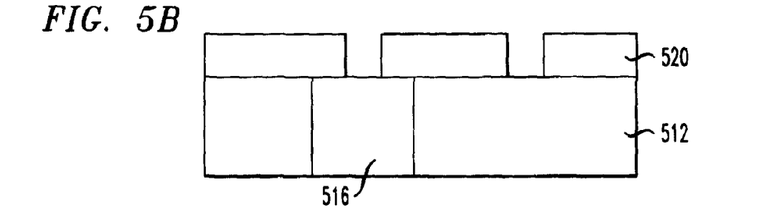

As shown in FIG. 5B, a mask layer 520, e.g., photoresist, is then deposited over insulating layer 512 and patterned with the location(s) of one or more features. For illustrative purposes, the formation of only two features is shown, e.g., one via or metal line in the implant region and one via or metal line outside of the implant region. However, it is to be understood that a plurality of the same and/or different features can be patterned at the same time.

Figure 5C:
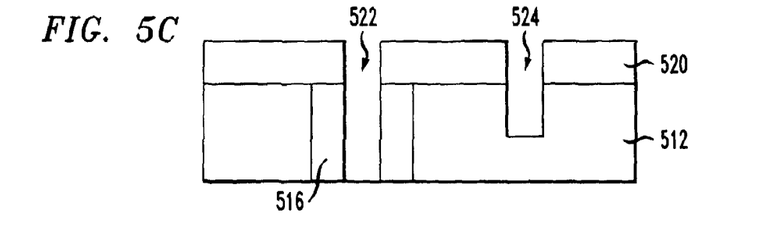

As shown in FIG. 5C, RIE is used to etch insulating layer 512 using mask layer 520 as a mask. In the exemplary embodiment shown in FIGS. 5A-F, implant region 516 is configured to have an enhanced etch rate, e.g., from implanted argon ions. As such, it is shown in FIG. 5C that in the time it took to etch only part way through insulating layer 512 outside of implant region 516, a complete etch through insulating layer 512 is accomplished within implant region 516. As a result of the etching, voids 522 and 524 are formed.

Figure 5D:
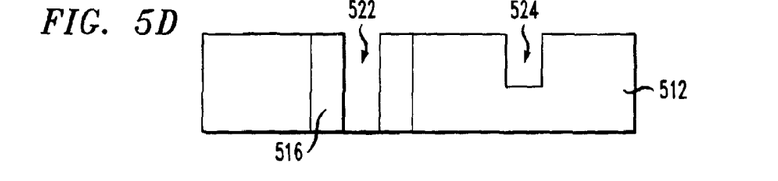
Figure 5E:
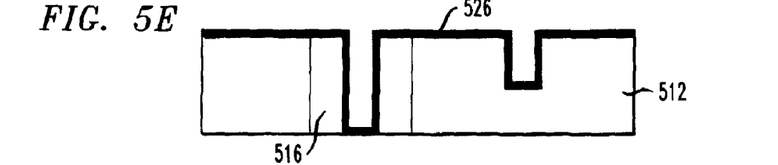

As shown in FIG. 5D, mask layer 520 is stripped from the surface of insulating layer 512 and the surface of insulating layer 512 is cleaned. As shown in FIG. 5E, a liner 526 is deposited along the bottoms and sidewalls of the voids, and on the surface of insulating layer 512. Liner 526 serves to prevent electromigration and can comprise, e.g., titanium nitride.

Figure 5F:
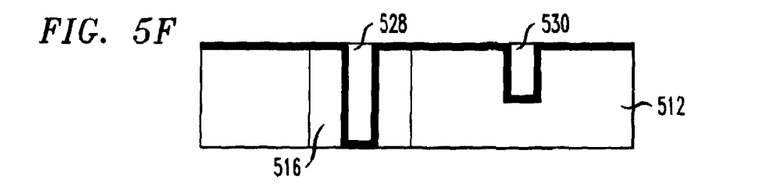

As shown in FIG. 5F, voids 522 and 524 are filled with a conductor material. A polishing technique, such as CMP, is then used to polish back the conductor material to the surface of insulating layer 512 (which additionally removes the liner from the surface of insulating layer 512). As such, features 528 and 530 are formed. By way of example only, features 528 and 530 can both comprise vias, wherein feature 528 is a true via and feature 530 is a false via.

FIGS. 6A-I are diagrams illustrating an exemplary methodology for forming a logic gate device using selectively altered etch rates to create false features as an anti-reverse engineering measure. This methodology can be used to form any one of a number of different circuit blocks including, but not limited to, random circuit devices, logic gate devices, NOR gate devices, NAND gate devices, XOR gate devices, as well as, inverters, buffers, latches and registers. For example, as will be described in detail below, this methodology can be employed to fabricate NOR and NAND gate devices having identical physical layout topologies with function varied solely by variations in a combined false via/true via layout. Therefore, from a top-down view, the NOR and NAND gate devices will appear identical to one another, making reverse engineering the devices extremely difficult.

Figure 6A:
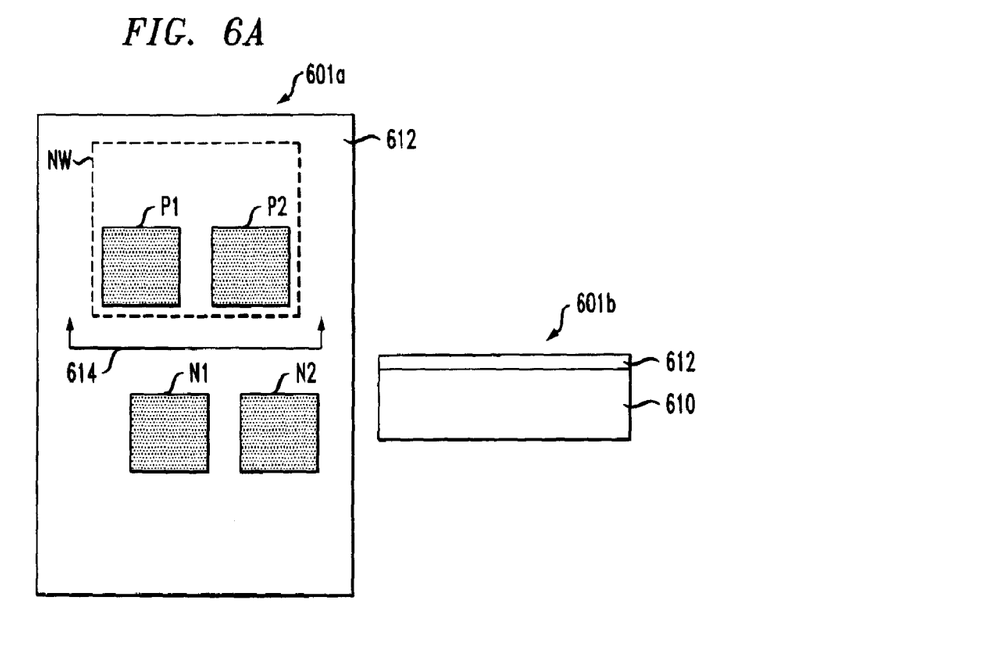

Namely, as shown in FIG. 6A by way of top-down view 601a and cross-sectional view 601b through plane 614, a substrate 610 is provided having active regions N1/P1 and N2/P2 (which will correspond to a first pair of n-channel metal-oxide semiconductor (NMOS)/p-channel metal-oxide semiconductor (PMOS) devices and a second pair of NMOS/PMOS devices, respectively) and n-well implant region NW defined therein. Dielectric layer 612 is present over substrate 610 and will serve as a gate dielectric to the metal-oxide semiconductor (MOS) device pairs. Dielectric layer 612 can comprise any suitable gate dielectric material, including, but not limited to, a nitride material, such as silicon nitride.

Figure 6B:
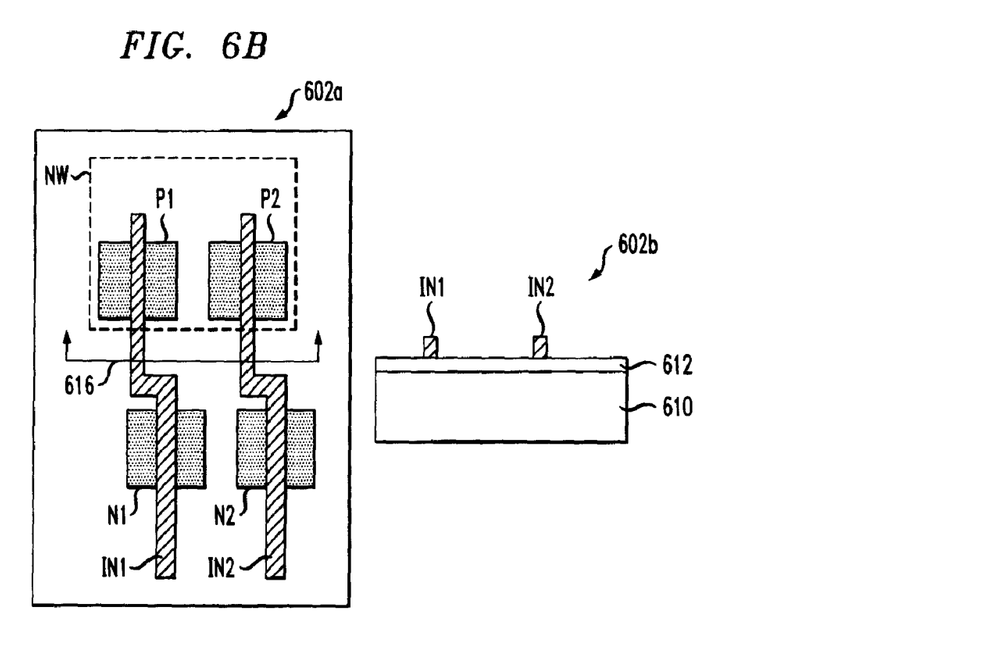

As shown in FIG. 6B by way of top-down view 602a and cross-sectional view 602b through plane 616, gate IN1 is formed as a common gate for the N1/P1 active regions and gate IN2 is formed as a common gate for the N2/P2 active regions. Sidewall spacers (not shown), commonly associated with a gate electrode, may be employed. Further, separated source and drain regions (not shown) are formed, i.e., by implantation in the active regions on opposite sides of gates IN1/IN2.

Figure 6C:
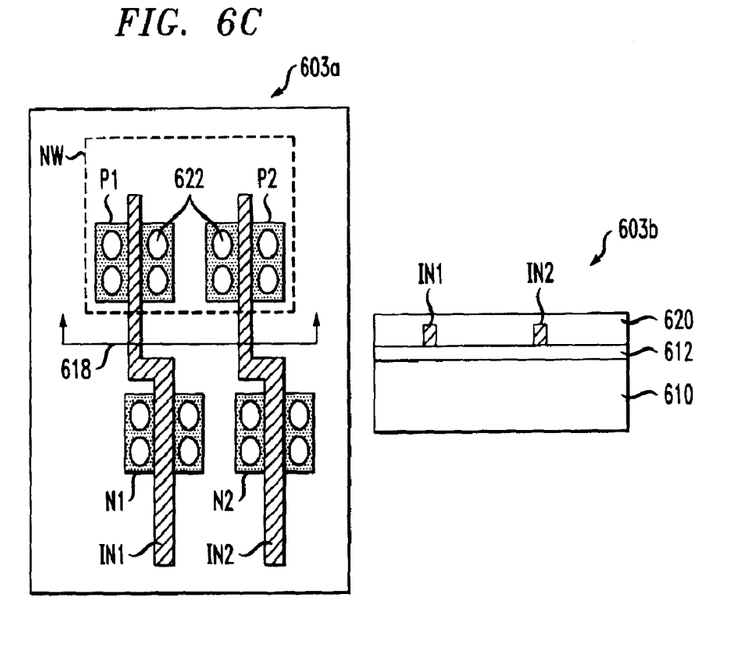

As shown in FIG. 6C by way of top-down view 603a and cross-sectional view 603b through plane 618, insulating layer 620 is deposited over dielectric layer 612 and gates IN1/IN2. According to an exemplary embodiment, dielectric layer 612 comprises a nitride material, such as silicon nitride (as described above), and insulating layer 620 comprises an oxide material, such as silicon oxide.

Contacts 622 are then formed. Contacts 622 will serve as electrical interconnects between a first metal layer of the device (see FIG. 6D, described below) and the source/drain regions formed above. As such, contacts 622 may also be referred to herein as "first level contacts." Contacts 622 extend through insulating layer 620 and dielectric layer 612.

Figure 6D:
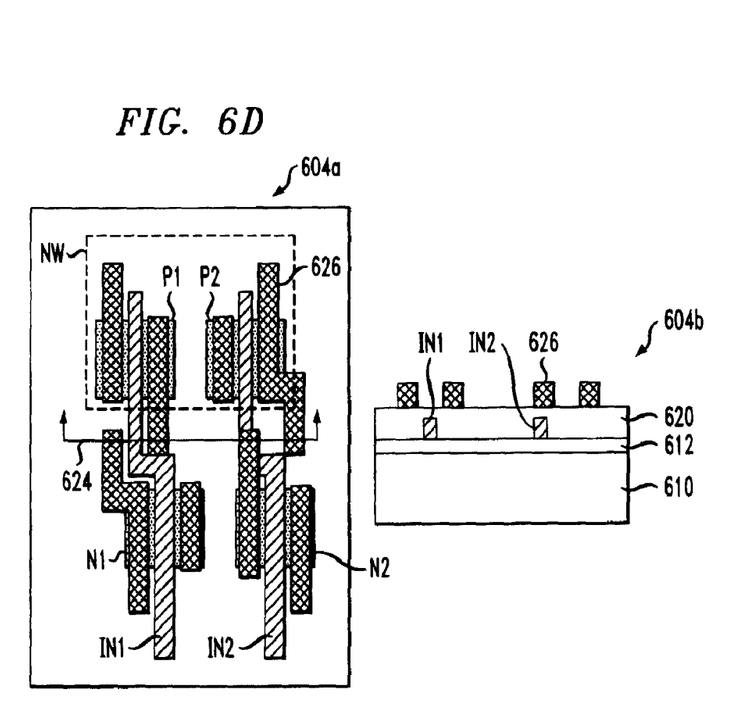

As shown in FIG. 6D by way of top-down view 604a and cross-sectional view 604b through plane 624, metal lines 626 are formed over insulating layer 620. Metal lines 626 make up a first metal layer of the device and, as highlighted above, are interconnected with the source/drain regions by contacts 622.

Metal lines 626 can be formed in one of a number of ways. According to one exemplary embodiment, a metal layer is deposited over insulating layer 620 and masked with a pattern for metal lines 626. RIE is then used to etch away unmasked portions of the metal layer, to reveal metal lines 626. According to an alternative embodiment, a damascene process is used to embed metal lines 626 within a surface of insulating layer 620.

Figure 6E:
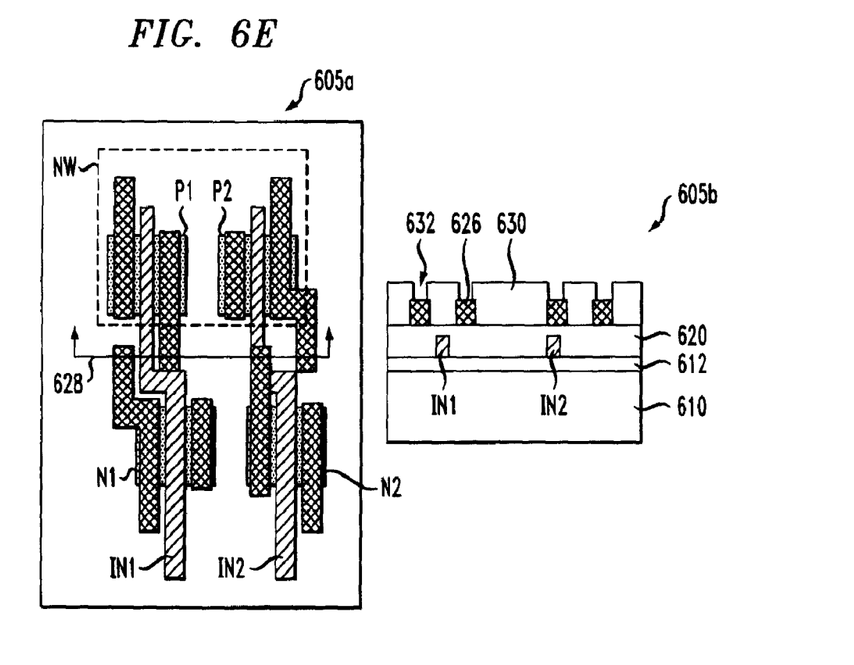

As shown in FIG. 6E by way of top-down view 605a and cross-sectional view 605b through plane 628, insulating layer 630 is deposited over insulating layer 620/metal lines 626. Like insulating layer 620, insulating layer 630 can also comprise an oxide material, such as silicon oxide. Voids, e.g., holes 632, are etched into insulating layer 630 in select positions above metal lines 626. For example, according to one embodiment, a photoresist is deposited over insulating layer 630, masked and patterned with the footprint and location of holes 632. RIE is then used to form holes 632, with metal lines 626 acting as an etch stop. Holes 632 will be used to form a plurality of false and true vias. The true vias will serve to interconnect the first metal layer with a second metal layer of the device.

Optionally, one or more of the optically transparent etch stop films described, for example, in conjunction with the description of FIGS. 1A-D, FIGS. 2A-D, FIGS. 3A-E and FIGS. 4A-D, above, may be used in the logic gate device, i.e., to isolate the false vias. For example, an optically transparent etch stop film may be deposited into one or more of holes 632 that will serve to form the false vias (not shown), e.g., using a lift-off mask procedure, as described in conjunction with the description of FIGS. 1A-D, above.

As highlighted above, the present techniques can be used to form NOR and NAND gate devices having identical physical layout topologies. Namely, the steps shown illustrated in FIGS. 6A-E (described above) are the same steps that are performed whether a NOR gate or a NAND gate device is being produced. From this point, however, the steps differ depending on whether a NOR gate or a NAND gate device is being produced. Namely, the steps shown illustrated in FIGS. 6F-G (described below) are directed to forming a NOR gate device, and the steps shown illustrated in FIGS. 6H-I (described below) are directed to forming a NAND gate device. The resulting NOR gate and NAND gate devices, however, will have identical physical layout topologies, just with variations in the layout of true/false vias.

Figure 6F:
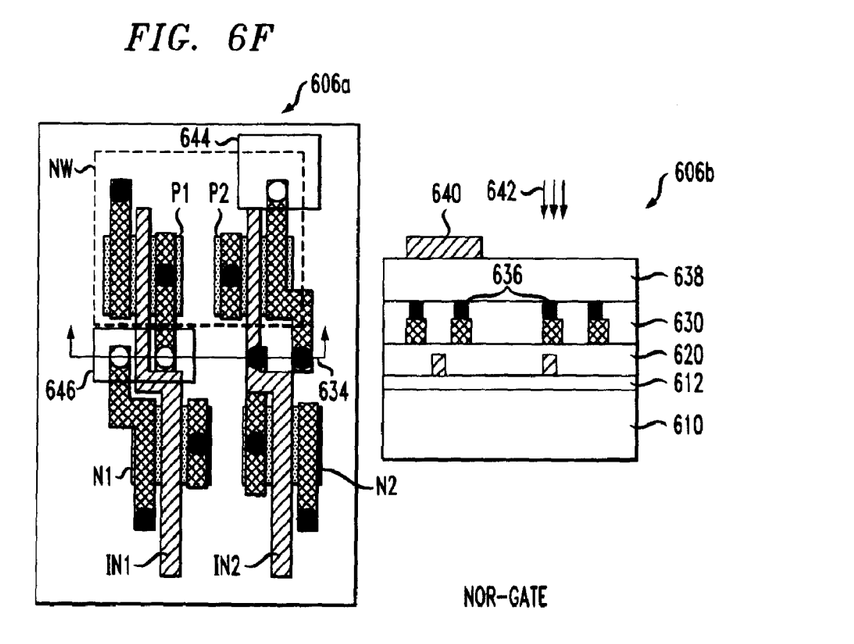

To form a NOR gate device, as shown in FIG. 6F by way of top-down view 606a and cross-sectional view 606b through plane 634, holes 632 (see, for example, FIG. 6E, described above) are filled with a conductor material, e.g., a conductive metal. A polishing technique, such as CMP, is then used to polish the metal down to the surface of insulating layer 630. As such, a plurality of vias 636 are formed. As highlighted above, some of the vias 636 formed will be false vias and others will be true vias. False vias are indicated in top-down view 606a as white circles and true vias are indicated in top-down view 606a as solid black circles.

To selectively form both false vias and true vias at the same time (i.e., by the same steps), the etch rate altering techniques described above are implemented as follows. An insulating layer 638 is deposited over insulating layer 630/vias 636. Like insulating layers 620 and 630, insulating layer 638 can also comprise an oxide material, such as silicon oxide. Block out masks 640 are provided over regions of the device (e.g., regions 644 and 646) that encompass those vias 636 that will form false vias.

Ions are then implanted into portions of insulating layer 638 that are not masked by block out masks 640 (as indicated by arrows 642). As described above, the implanted ions are configured to alter the etch rate through the implanted regions of the insulating layer. In the exemplary embodiment shown in FIGS. 6A-I, the implanted ions, e.g., argon ions, are configured to enhance the etch rate through the implanted regions of insulating layer 638.

According to an alternative embodiment (not shown), block out masks can be provided over regions of the device that encompass those vias 636 that will form true vias. Nitrogen ions can then be implanted into portions of insulating layer 638 not masked by the block out masks, to form a nitride in the implant regions, and thereby reduce the etch rate through the implanted regions.

Optionally, one or more of the optically transparent etch stop films described, for example, in conjunction with the description of FIGS. 1A-D, FIGS. 2A-D, FIGS. 3A-E and FIGS. 4A-D, above, may be used in the logic gate device, i.e., to isolate the false vias. For example, a recess can be formed in a top portion of one or more of vias 636 that are to form false vias, and the recess filled with an optically transparent etch stop material (not shown), as described in conjunction with the description of FIGS. 3A-E, above.

Figure 6G:
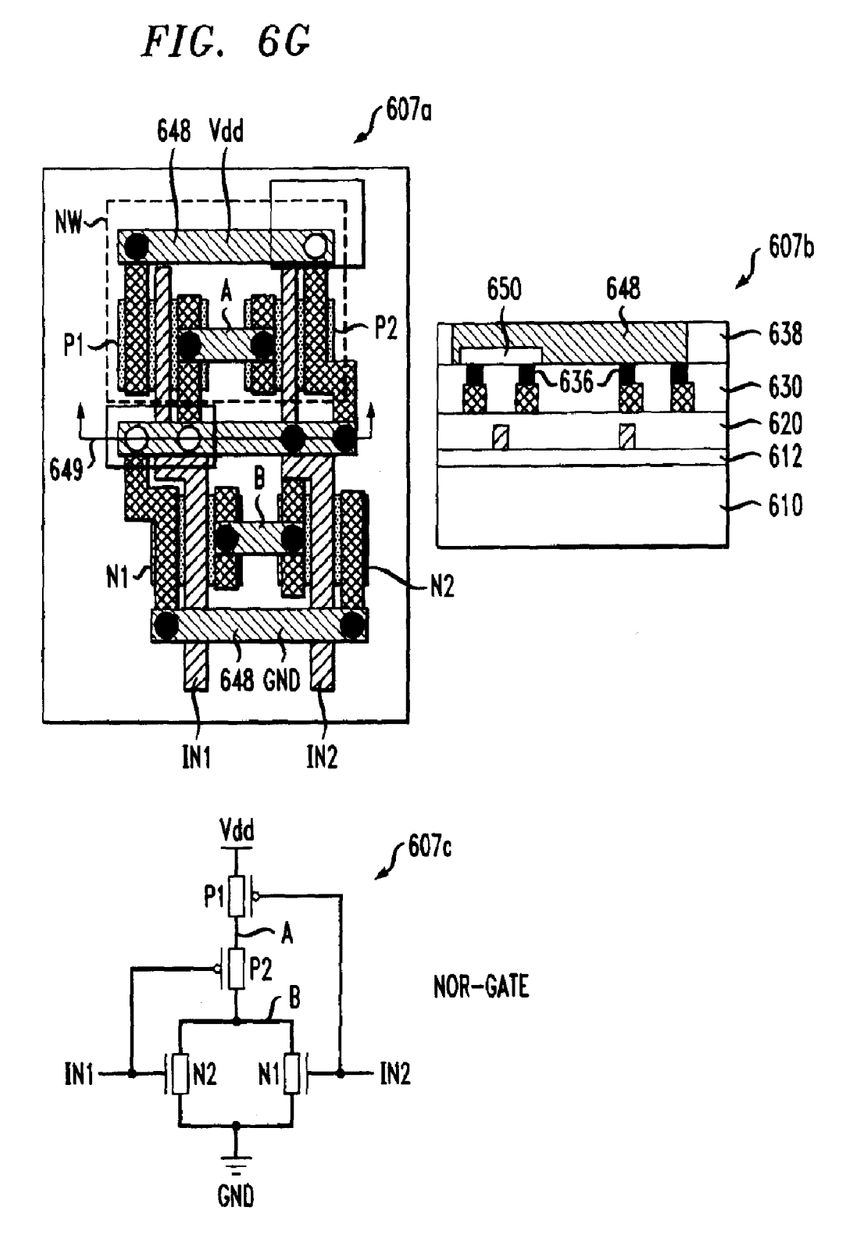

As shown in FIG. 6G by way of top-down view 607*a* and cross-sectional view 607*b* through plane 649, metal lines 648 are formed in insulating layer 638. Metal lines 648 will form the second metal layer of the device.

According to an exemplary embodiment, metal lines 648 are formed by first etching a pattern in insulating layer 638 and then filling the pattern with a metal, such as copper, to form metal lines 648. The etch rate through the implant regions in insulating layer 638 (see, for example, the description of FIG. 6F, above) is faster than through the unmodified, i.e., non-implant, regions under block out masks 640. As a result, portions 650 of insulating layer 638 remain over those vias 636 that were selected to form false vias. The remaining portions 650 of insulating layer 638 over the false vias prevent contact between the false vias and metal lines 648. Thus, metal lines 648 will be in a non-contact position with those vias 636 (false vias) that are covered by portions 650 of insulating layer 638. Conversely, metal lines 648 will be in a contact position with those vias 636 (true vias) that are not covered by portions 650 of insulating layer 638.

Reverse engineering attempts on multi-layer circuits typically comprise systematically removing layers to try and ascertain what components are present, and how the components are interconnected. For example, etching, grinding and/or polishing are often used to disassemble a circuit layer by layer.

With the present logic gate device, however, this layer by layer analysis would not reveal the true device structure. Namely, a top-down inspection of metal lines 648 would lead one to believe that metal lines 648 make contact with all of the vias 636 thereunder. If the second metal layer is then removed from the device, e.g., by etching or polishing down to vias 636, a top-down inspection would reveal that all of the vias 636 are present. Namely, the disassembly process would remove any evidence of the portions of the insulating layer, i.e., portions 650, preventing contact between the false vias and the second metal layer.

Figure 6H:
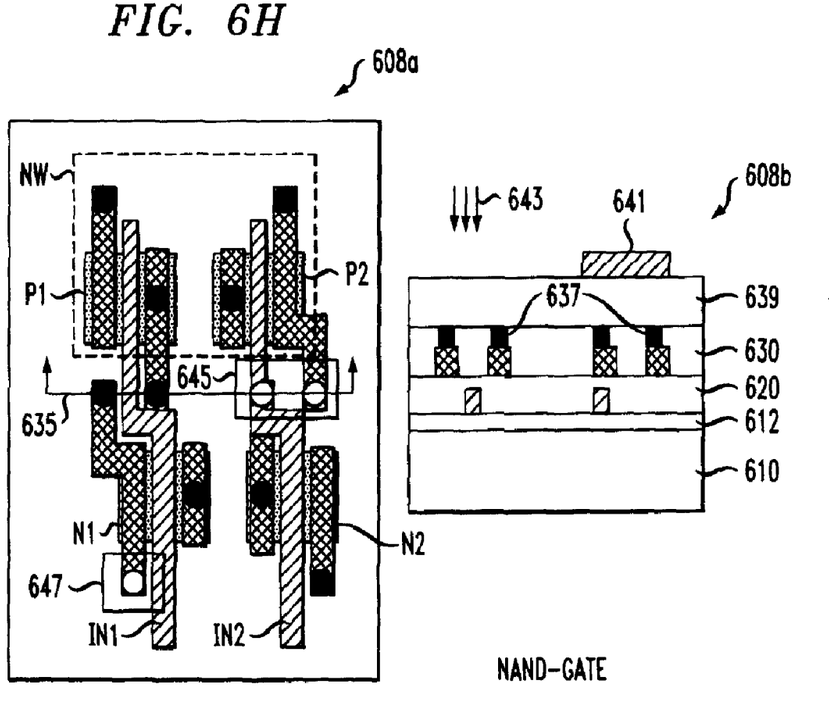

Alternatively, to form a NAND gate device, as shown in FIG. 6H by way of top-down view 608*a* and cross-sectional view 608*b* through plane 635, holes 632 (see, for example, FIG. 6E, described above) are filled with a conductor material, e.g., a conductive metal, and then polished down to the surface of insulating layer 630, to form a plurality of vias 637. Some of the vias 637 formed will be false vias and others will be true vias. False vias are indicated in top-down view 608*a* as white circles and true vias are indicated in top-down view 608*a* as solid black circles.

To selectively form both false vias and true vias at the same time (i.e., by the same steps), the etch rate altering techniques described above are implemented as follows. An insulating layer 639 is deposited over insulating layer 630/vias 637. Like insulating layers 620 and 630, insulating layer 639 can also comprise an oxide material, such as silicon oxide. Block out masks 641 are provided over regions of the device (e.g., regions 645 and 647) that encompass those vias 637 that will form false vias.

Ions are then implanted into portions of insulating layer 639 that are not masked by block out masks 641 (as indicated by arrows 643). As described above, the implanted ions are configured to alter the etch rate through the implanted regions of the insulating layer. In the exemplary embodiment shown in FIGS. 6A-I, the implanted ions, e.g., argon ions, are configured to enhance the etch rate through the implanted regions of insulating layer 639.

According to an alternative embodiment (not shown), block out masks can be provided over regions of the device that encompass those vias 637 that will form true vias. Nitrogen ions can then be implanted into portions of insulating layer 639 not masked by the block out masks, to form a nitride in the implant regions, and thereby reduce the etch rate through the implanted regions.

Optionally, one or more of the optically transparent etch stop films described, for example, in conjunction with the description of FIGS. 1A-D, FIGS. 2A-D, FIGS. 3A-E and FIGS. 4A-D, above, may be used in the logic gate device, i.e., to isolate the false vias. For example, a recess can be formed in a top portion of one or more of vias 637 that are to form false vias, and the recess filled with an optically transparent etch stop material (not shown), as described in conjunction with the description of FIGS. 3A-E, above.

As shown in FIG. 6I by way of top-down view 609*a* and cross-sectional view 609*b* through plane 651, metal lines 653 are formed in insulating layer 639. Metal lines 653 will form the second metal layer of the device.

According to an exemplary embodiment, metal lines 653 are formed by first etching a pattern in insulating layer 639 and then filling the pattern with a metal, such as copper, to form metal lines 653. The etch rate through the implant regions in insulating layer 639 (see, for example, the description of FIG. 6H, above) is faster than through the unmodified, i.e., non-implant, regions under block out masks 641. As a result, portions 655 of insulating layer 639 remain over those vias 637 that were selected to form false vias. The remaining portions 655 of insulating layer 639 over the false vias prevent contact between the false vias and metal lines 653. Thus, metal lines 653 will be in a non-contact position with those vias 637 (false vias) that are covered by portions 655 of insulating layer 639. Conversely, metal lines 653 will be in a contact position with those vias 637 (true vias) that are not covered by portions 655 of insulating layer 639.

With the present logic gate device, a layer by layer reverse engineering analysis would not reveal the true device structure. Namely, a top-down inspection of metal lines 653 would lead one to believe that metal lines 653 make contact with all of the vias 637 thereunder. If the second metal layer is then removed from the device, e.g., by etching or polishing down to vias 637, a top-down inspection would reveal that all of the vias 637 are present. Namely, the disassembly process would remove any evidence of the portions of the insulating layer, i.e., portions 655, preventing contact between the false vias and the second metal layer.

By comparing top-down view 607*a* of FIG. 6G (NOR gate) with top-down view 609*a* of FIG. 6I (NAND gate), it is clear that the resulting NOR gate and NAND gate devices have the same physical layout topology as one another, e.g., the NAND gate and the NOR gate have the same metal layers, contacts and vias in the same locations and positions relative to one another. The only difference is the selection of which vias are true vias and which vias are false vias. Thus, from a reverse engineering perspective, the devices are physically the same. However, a comparison of NOR gate circuit 607*c* of FIG. 6G with NAND gate circuit 609*c* of FIG. 6I shows that, by varying the implant regions and resulting false via/true via layouts, as described above, different logic gate circuits can be fabricated. Thus, the present teachings advantageously provide techniques for producing circuit blocks, such as NOR gate and NAND gate logic blocks, that appear physically identical to one another, but perform different functions.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a logic gate, the method comprising the steps of:
    fabricating at least one metal oxide semiconductor device on a substrate;
    depositing at least one first insulating layer over the device;
    forming a first metal layer over the first insulating layer, the first metal layer being interconnected with the device by way of one or more contacts present through the first insulating layer;
    depositing at least one second insulating layer over the first metal layer;
    forming a plurality of vias in the second insulating layer in contact with the first metal layer;
    depositing at least one third insulating layer over the second insulating layer, so as to cover the vias; and
    forming a second metal layer in the third insulating layer, by the steps of:
        selectively implanting ions in the third insulating layer so as to form at least one implant region over one or more of the vias, the implanted ions being configured to alter an etch rate through the third insulating layer within the implant region;
        etching the third insulating layer to, at the same time, form a pattern for the second metal layer both within the implant region and outside of the implant region, wherein the etch rate through the third insulating layer within the implant region is different from an etch rate through the third insulating layer outside of the implant region, and wherein the etch is performed for an amount of time needed to either etch completely through the third insulating layer within the implant region or etch completely through the third insulating layer outside of the implant region; and
        filling the pattern with a conductor material to form the second metal layer, wherein the second metal layer is in a non-contact position with one or more of the vias.

2. The method of claim 1, further comprising the steps of:
    selecting one or more of the vias to form false vias; and
    selecting one or more of the vias to form true vias.

3. The method of claim 1, wherein the step of forming the plurality of vias in the second insulating layer, further comprises the steps of:
    etching a plurality of voids into the second insulating layer;
    filling the voids with a conductor material to form the vias; and
    placing an optically transparent etch stop film over a select one or more of the vias.

4. The method of claim 3, wherein the placing step further comprises the steps of:
    forming a recess in a top portion of one or more of the select vias; and
    placing the optically transparent etch stop film within the recess.

5. The method of claim 1, wherein the step of forming the plurality of vias in the second insulating layer, further comprises the steps of:
    etching a plurality of voids into the second insulating layer;
    placing an optically transparent etch stop film in a bottom of a select one or more of the voids; and
    filling the voids with a conductor material to form the vias.

6. The method of claim 1, further comprising the steps of:
    placing at least one optically transparent etch stop film over the first metal layer;
    depositing the second insulating layer over the first metal layer and the optically transparent etch stop film;
    etching a plurality of voids into the second insulating layer; and
    filling the voids with a conductor material to form the vias, wherein one or more of the vias formed are in contact with the optically transparent etch stop film.

* * * * *